(12) United States Patent
Bidenbach

(10) Patent No.: US 6,963,234 B2
(45) Date of Patent: Nov. 8, 2005

(54) PHASE REGULATING CIRCUIT WITH A TIME-DELAY ELEMENT

(75) Inventor: Reiner Bidenbach, Vörstetten (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 10/416,618

(22) PCT Filed: Nov. 21, 2001

(86) PCT No.: PCT/EP01/13517

§ 371 (c)(1),
(2), (4) Date: Jul. 24, 2003

(87) PCT Pub. No.: WO02/43246

PCT Pub. Date: May 30, 2002

(65) Prior Publication Data

US 2004/0090250 A1 May 13, 2004

(30) Foreign Application Priority Data

Nov. 21, 2000 (DE) .......................... 100 57 905

(51) Int. Cl.$^7$ ................................................ H03L 7/06
(52) U.S. Cl. ................................ 327/158; 331/DIG. 2; 375/376
(58) Field of Search ................................ 327/156, 158, 327/159–161, 149–150, 153; 331/1 A, DIG. 2, 17; 375/373–376

(56) References Cited

U.S. PATENT DOCUMENTS

| 4,568,887 A | 2/1986 | Bierhoff | 331/1 R |
| 4,965,815 A | 10/1990 | Boudewijns | 375/373 |
| 5,159,205 A | 10/1992 | Gorecki et al. | 327/150 |
| 5,260,608 A | 11/1993 | Marbot | 327/261 |
| 5,548,235 A | 8/1996 | Marbot | 327/158 |
| 5,786,715 A * | 7/1998 | Halepete | 327/116 |
| 5,838,178 A | 11/1998 | Marbot | 327/116 |
| 5,994,934 A | 11/1999 | Yoshimura et al. | 327/158 |
| 6,037,812 A | 3/2000 | Gaudet | 327/116 |
| 6,150,855 A | 11/2000 | Marbot | 327/116 |
| 6,184,753 B1 * | 2/2001 | Ishimi et al. | 331/34 |
| 6,437,616 B1 * | 8/2002 | Antone et al. | 327/158 |
| 2003/0188235 A1 * | 10/2003 | Kozaki | 714/700 |

FOREIGN PATENT DOCUMENTS

| EP | 0 460 274 | 12/1991 |
| JP | 2000022524 | 1/2000 |

* cited by examiner

Primary Examiner—Minh Nguyen
(74) Attorney, Agent, or Firm—O'Shea, Getz & Kosakowski, P.C.

(57) ABSTRACT

A phase-locked loop with a delay element (DLL) is described which is essentially characterized in that the delay element (3) has a chain of a number n delay units (33n), the outputs (34n) of which are fed to a locking monitoring circuit (4) which determines whether the delay time $T_{delay}$ of the delay element (3) lies within a range $a*T_{period} < T_{delay} < b*T_{period}$, where $0.5 < a < 1$ and $1 < b < 2$, and wherein the locking monitoring circuit (4) performs a correction of this delay time when this condition is not met.

10 Claims, 2 Drawing Sheets

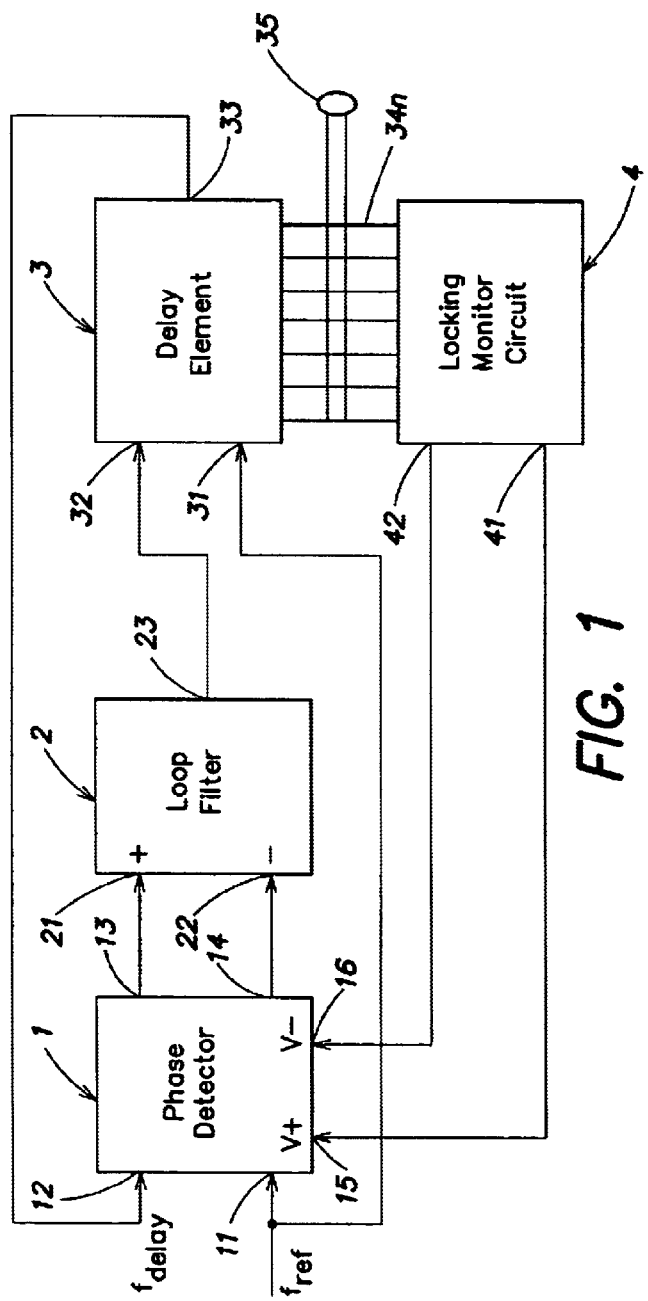
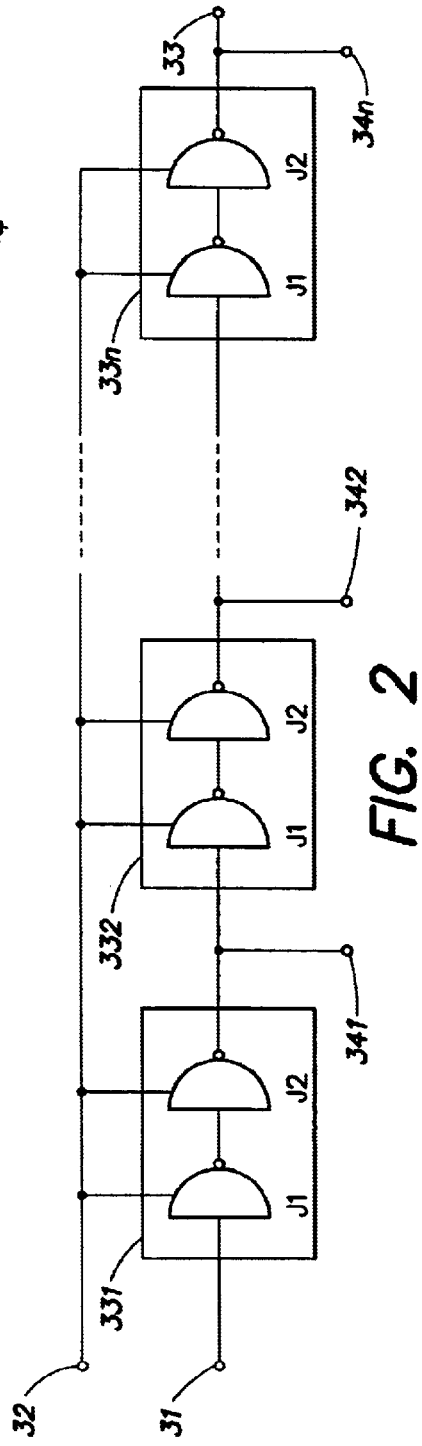
FIG. 1
FIG. 2

PHASE REGULATING CIRCUIT WITH A TIME-DELAY ELEMENT

BACKGROUND OF THE INVENTION

The present invention relates to the field of phase-locked loops.

Unlike a phase-locked loop (PLL) with a self-oscillating oscillator, a phase-locked loop with a delay element (i.e., a delay locked loop—DLL) has the problem that the delayed output signals of the delay element are indistinguishable for all delays that correspond to an integer multiple of the clock pulse of the input signal. Therefore, the danger exists that the delay time will be set as an indeterminate integer multiple of the period of the input signal.

To prevent this from occurring, one known method is to limit the possible delay time of the delay element. However, this measure has the disadvantage that the frequency range is significantly limited. Especially in the case of integrated circuits, there is the additional problem that absolute precision is required for the limiter. If the ratio of the signal to the clock pulse space of the input signal deviates from 50%, an additional downward limitation of the delay time is required, with the result that the frequency range is limited still further.

Another known approach avoids the setting of the delay time as an indeterminate integer multiple of the period of the input signal by generating an allocation or detection of the association of the edges of the output signal with the edges of the input signal. However, this approach is quite complex and expensive, and almost impossible to implement, especially at high frequencies.

Therefore, there is a need for a phase-locked loop in which nonpermissible delay times are detected and eliminated by appropriate corrections.

SUMMARY OF THE INVENTION

This purpose is achieved with a phase-locked loop of the type referred to in the preamble according to claim 1 wherein the delay element has a chain of a number n delay units, the outputs of which are fed to a locking monitoring circuit which determines whether the delay time $T_{delay}$ of the delay element relative to the period $T_{period}$ of an input signal lies within a range $(a*T_{period})<T_{delay}<(b*T_{period})$, where $0.5<a<1$ and $1<b<2$, and where the locking monitoring circuit performs a correction of the delay time when this condition is not met.

These and other objects, features and advantages of the present invention will become more apparent in light of the following detailed description of preferred embodiments thereof, as illustrated in the accompanying drawings.

BRIEF DESCRIPTION OF THE DRAWING

FIG. 1 is a schematic circuit diagram of such an embodiment;

FIG. 2 is a schematic circuit diagram of a delay element; and

DETAILED DESCRIPTION OF THE INVENTION

Figure 3:
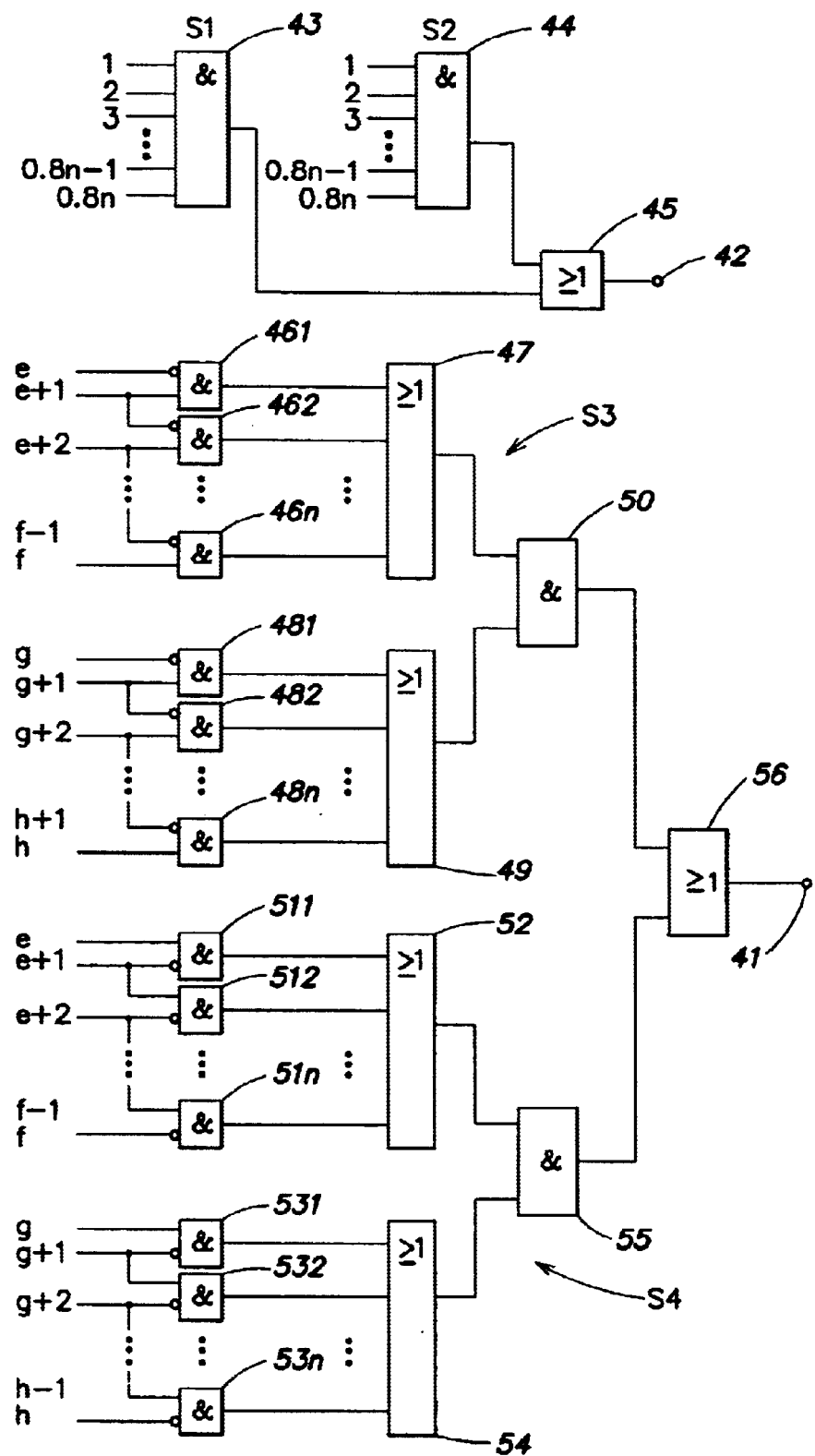
FIG. 3 is a schematic circuit diagram of a locking monitor circuit.

The circuit shown in FIG. 1 includes a phase detector 1, a loop filter 2, a delay element 3 with a chain of delay units, and a locking monitor circuit 4.

An input signal with a reference frequency $f_{ref}$ is applied to a first input 11 of the phase detector 1, and to a first input 31 of the delay element 3. The phase detector has a second input 12 for a feedback signal from the delay element 3 with a frequency $f_{delay}$ which is fed through an output 33 of the delay element 3. The delay units contained in the delay element are each connected through one of connecting lines 34n(n=1, 2, 3, . . . ) to the locking monitoring circuit 4 and a circuit output 35.

The loop filter 2 has a first positive input 21 and a second negative input 22. A first output 13 of the phase detector 21 is applied to the first input 21, while the second input 22 of the loop filter 2 is connected to a second output 14 of the phase detector 1. The output 23 of the loop filter 2 is connected to a second input 32 of the delay element 3 for a control voltage.

Finally, a first output 41 of the locking monitor circuit 4 is connected to a positive (V+) input 15, while a second output 42 of the locking monitor circuit 4 is connected to a negative (V−) input 16 of the phase detector 1.

FIG. 2 is a schematic circuit diagram of one example of the delay element 3. It is composed of a series circuit with n delay units 33n(n=1, 2, . . . ) which are each formed by two series-connected inverters J1, J2. The input of the first delay unit 331 is connected to the first input 31 of the delay element 3, while the output of the last delay unit 33n is applied to the output 33 of the delay element 3. The output of each delay unit 33n is connected to one of connecting lines 34n leading to the locking monitor circuit 4. Finally, the inverters J1, J2 of the delay units 33n are controlled through a common control line connected to the second input 32 of the delay element 3.

FIG. 3 is an example of a schematic circuit diagram of the locking monitor circuit 4. The circuit includes four stages S1 through S4. First stage S1, which serves to evaluate "high" states of delay units 33n, creates an AND relation of the signals fed through connecting lines 34n(n=1, 2, 3, . . . ) with a first AND element 43, where a factor of, for example, (0.8*n) signals is employed. Second stage S2, which serves to evaluate the "low" states of delay units 33n, inverts these supplied signals (factor multiplied by n) and then creates a second AND relation to a second AND element 44. The outputs of the two AND elements 43, 44 are gated to an OR element 45, the output of which is connected to the second output 42 of the locking monitor circuit 4.

The third stage S3 evaluates the falling edges of the outputs of the delay units 33n and includes n first AND elements 46n, the outputs of which are each fed to a second OR element 47. Third stage S3 also includes n third AND elements 48n(n=1, 2, 3, . . . ), the outputs of which are each fed to a fourth OR element 49. Finally, the outputs of the second and fourth OR elements 47 and 49 are input to an AND element 50. Two successive outputs e, e+1, . . . ; g, g+1, . . . of certain delay units 33n of delay element 3 are applied to the two inputs of the first and third AND elements 46n, 48n, where in each case a first input is inverted and a second input is noninverted. Selection of the outputs is described in more detail below.

Fourth stage S4 evaluates the rising edges of the outputs of delay units 33n and is designed analogously to third stage S3 with analogous elements 51n, 52, 53n, 54,55(n=1, 2, 3, . . . ). The same is true of the signals applied to the inputs of the first and third AND elements 51n, 53n. The only difference is that the first inputs of the first and third AND elements 51n, 53n are noninverting, while the second inputs of these elements are inverting. The outputs of the AND elements 50 and 55 of the third or fourth stage are fed to a fifth OR element 56, the output of which is connected to the positive first output 41 of the locking monitor circuit 4.

The following discussion presents the functions and operation (in principle) of the phase-locked loop.

Based on the fact that the delay element 3 is formed by a chain of n delay units 33n (FIG. 2), the state of the outputs of these delay units at the connecting lines 34n may be employed to detect impermissible delay times, and to cause the locking monitor circuit 4 to perform corresponding corrections.

To accomplish this, the locking monitor circuit 4 determines whether the delay time $T_{delay}$ of the delay element 3 lies in a range $(a*T_{period}) < T_{delay} < (b*T_{period})$ relative to the period $T_{period}$ of the input signal, where 0.5<a<1 and 1<b<2. The precise values of a and b depend on the implementation of the locking monitor circuit 4, which in turn is essentially determined by the characteristics of the phase detector 1.

If the delay element 3 includes n delay units 33n, then a maximum delay time of $(n*T_{period})$ may be detected by the locking monitor circuit 4. In practice, this is not a limitation since $(T_{delay\ unit} < T_{period})$ applies for almost all types of delay units.

The determination as to whether $T_{delay} < (a*T_{period})$ may be made based on the number of like successive states in the chain of n delay units 33n.

Given a clock pulse/space ratio of 50% of the input signal, this is (0.5*n) delay units for a =1, and (1*n) delay units for a =0.5. This means that, given a number m of successive delay units of the same state, where (0.5*n)<m<n, the locking monitor circuit 4 must give the phase detector 1 the priority signal "−". This means that the signal of the locking monitor circuit 4 has priority over the signal of the phase detector 1. As a result, the delay time is increased until the above-mentioned condition is no longer met and the phase detector 1 itself takes over the fine adjustment of the delay time.

When a clock pulse/space ratio is not equal to 50%, both states (low and high) of the input signal must be monitored, and the results OR-gated. This means that each of the two results for low or high states may produce a signal at the first output 41 of the locking monitor circuit 4. Given a clock pulse/space ratio not equal to 50%, the adjustment range of the phase detector 1 is limited. This limitation is due to the fact that the phase detector 1 makes its decision not solely based on, for example, a rising signal edge, as is generally the case with PLL circuits. Instead, additional time information between two homogeneous edges is required, which indicates the end of the time range valid for evaluation. Ideally, this time information is situated precisely in the middle between two homogeneous edges. However, time information of this sort may be obtained only with considerable complexity and cost. For this reason, another edge type, such as a falling edge, is preferably used instead. When in this case the clock pulse/space ratio is not equal to 50 percent, the time range valid for edge evaluation is limited. This is based on the fact that the edge of the other type does not lie precisely in the middle of the period.

In addition, the value of a must be chosen, such that $a > (T_{high}/T_{period})$ AND $a > (T_{low}/T_{period})$ is true.

In principle, the values a and b are variable and are determined by the implementation of the circuit, that is, the number n delay units 33n, the number of successively monitored units, and the capture range of the phase detector 1. To the extent the capture range of the phase detector 1 is also a function of the clock pulse/space ratio, as is true in the case described above, the values of a and/or b are also determined by this ratio.

The determination as to whether $(T_{delay} > b*T_{period})$ may also be made based on the number of like successive states in the chain of n delay units 33n. For the limit b=2, n/4 successive delay units must have the same state, while for b=1 this number must be n/2. In other words, if p successive delay units never have the same state simultaneously, where (n/4)<p<(n/2), then the locking monitor circuit 4 sends a priority "+" signal through the output 41 to the phase detector 1 (that is, the signal of the locking monitor circuit 4 has priority over the signal of the phase detector 1) in order to shorten the delay time.

Given a clock pulse/space ratio not equal to 50%, both states, namely low and high, must be monitored, as was true when monitoring $T_{delay} < (a*T_{period})$, where again the results of both tests must be OR-gated.

In one embodiment, this decision process proceeds in four stages. The first and second stages S1 and S2 test for the presence of the condition $T_{delay} < (a*T_{period})$. When this condition is detected in at least one of these two stages, the priority signal "−" having priority over the signal of the phase detector 1 is set at the second output 42 of the locking monitor circuit 4. The stages S3 and S4 of the decision process test for the presence of the condition $T_{delay} > (b*T_{period})$. If this condition is detected in at least one of the stages S3 and S4, the priority signal "+" relative to the signal of the phase detector 1 is set at the first output 41 of the locking monitor circuit 4. This four-stage test is required only when the clock pulse/space ratio is not equal to 50 percent. When, however, this ratio does equal 50 percent, a two-stage decision process is sufficient since the results of the first and second stages S1, S2 are identical with the results of the third and fourth stages S3, S4.

One disadvantage of this method is that, as the clock pulse asymmetry of the input signal increases, the value selected for b must become larger and larger. At the limit of 25% or 75% for the clock pulse/space ratio, b=2 applies; given an even greater asymmetry, this method is no longer possible.

It is therefore preferable to determine whether $T_{delay} > (b*T_{period})$ by a different method. Instead of evaluating successive states, the signal transitions (edges) are detected in the chain of n delay units 33n. The evaluation may be limited to one type of edges, that is, rising or falling. It is expedient to take the type of edges which are also utilized by the phase detector 1 as the time-critical edges. What is detected is whether the same type of edges appear in two different regions in the chain of n delay units 33n. For b=1, the beginning of region 1(e) extends to the end of region 2(h) over all n delay units. For b=2, the beginning of region 1(e) extends to the end of region 2(h) over n/2 delay units. What must be true for the length of the two regions is that it must be more than one quarter the distance from the beginning of region 1(e) to the end of region 2(h): (f−e)>(h−e)/4 AND (h−g)>(h−e)/4.

Here (e) is the number of the delay unit at the beginning of region 1, (f) is the number of the delay unit at the end of region 1, (g) is the number of the delay unit at the beginning of region 2, and (h) is the number of the delay unit at the end of region 2.

Numbering is continuous, beginning with number 1 at the beginning of the delay chain through number n at the end of the chain.

In the event one type of edge appears simultaneously in both the regions of the delay element 3 so defined, the locking monitor circuit 4 sends a priority "+" signal to phase detector 1 through the first output 41 (that is, the signal of the locking monitor circuit 4 has priority over the signal of phase detector 1) so as to reduce the delay time $T_{delay}$.

Essentially, only one type of the phase detector 1 may be employed which covers a maximum range of less than 360 degrees. Sequential phase detectors with a coverage of 720 degrees or more, often used in PLLs, are less suited for this purpose.

An ideal phase detector 1 would have a coverage range of −180+e degrees to +180−e degrees, where e>0 and e−>0. For the principle presented according to the invention, a phase detector of this type is especially well suited for every clock pulse/space ratio. There is some technical difficulty, however, in obtaining information on one half the clock period $T_{period}/2$ since, as the above explanation indicates, additional time information is required.

A preferred approach is therefore to employ a phase detector for which the coverage region is controlled by both edge types. Given an asymmetrical clock pulse/space ratio, the coverage region of such a phase detector is also asymmetrical; it is then $-360°*(1-[T_{high}/T_{period}])$<coverage region<$360°*[T_{high}/T_{period}]$ or $-360°*(1-[T_{low}/T_{period}])$<coverage region<$360°*[T_{low}/T_{period}]$, depending on which edge type is used to set or reset the "+"/"−" signals.

Care must be taken that the value of b, and thus the size of the detection regions (f−e) and (h−g) are chosen such that the locking monitor circuit 4 releases control of the phase detector 1 only when the phase position of the input signals of the phase detector 1 lies within the coverage range of the detector. If this rule is ignored, control of the locked state may not be achieved cleanly and may oscillate. Although the locking monitor circuit 4 then brings $T_{delay}$ closer to $T_{period}$, this is not close enough for the phase detector 1. It may still be possible for $T_{delay}$ to enter the capture range of the phase detector and allow the control to lock in. However, it is also possible for $T_{delay}$ to drift again from the capture range. In this case, the control oscillates and is not able to lock in.

If, for example (h−e)=(0.8*n) is chosen, the result is a maximum phase position of 90° at the phase detector 1. In this case, the minimum or maximum allowed clock pulse 1 space ratio is 25% or 75%, respectively, depending on the type of edges which are evaluated in phase detector 1.

The phase-locked loop according to the invention is preferably suited for generating shifted clock pulses in multiclock systems, or clockjitterers, and clock multipliers, clock balancers to obtain 50% clock pulse/space ratios from any asymmetrical clock pulses.

Although the present invention has been shown and described with respect to several preferred embodiments thereof, various changes, omissions and additions to the form and detail thereof, may be made therein, without departing from the spirit and scope of the invention.

What is claimed is:

1. A phase-locked loop, comprising: a phase detector, loop filter, and delay element, wherein the delay element has a chain of n delay units, the outputs of which are fed to a locking monitoring circuit which determines whether the delay time $T_{delay}$ of the delay element lies within a range $a*T_{period}<T_{delay}<b*T_{period}$ relative to a period $T_{period}$ of an input signal at the phase detector, where 0.5<a<1 and 1<b<2, and where the locking monitoring circuit performs a correction of the delay time when this condition is not met.

2. The phase-locked loop of claim 1, wherein the condition that $T_{delay}<a*T_{period}$ is tested by a number m of successive delay units with the same state.

3. The phase-locked loop of claim 2, wherein given a clock pulse-/-space ratio for the input signal of approximately 50 percent, the locking monitor circuit 4 performs a correction by signaling the phase detector to increase the delay time when the condition 0.5*n<m<n is true.

4. The phase-locked loop of claim 2, wherein given a clock pulse-/-space ratio for the input signal not equal to 50 percent, the low and high states of the delay units are monitored, and the results are OR-gated, with the value of a being selected such that the condition $a>T_{high}/T_{period}$ AND $a>T_{low}/T_{period}$ is true.

5. The phase-locked loop of claim 1, wherein the condition $T_{delay}>b*T_{period}$ is tested by a number p of successive delay units which at no time have the same state.

6. The phase-locked loop of claim 5, wherein given a clock pulse-/-space ratio for the input signal of approximately 50 percent, the locking monitor circuit performs a correction by signaling the phase detector (1) to reduce the delay time when the condition n/4<p<n/2 is true.

7. The phase-locked loop of claim 5, wherein given a clock pulse-/-space ratio for the input signal that is not equal to 50 percent, the low and high states of the delay units are monitored, and the results OR-gated.

8. The phase-locked loop of claim 1, wherein the condition $T_{delay}>b*T_{period}$ is determined by the same type of rising and-/or falling signal transitions in at least two different regions of the chain of n delay units, and a correction is performed by reducing the delay time by signaling the phase detector when one type of signal transition occurs simultaneously in both regions of the locking monitor circuit.

9. The phase-locked loop of claim 8, wherein for a value b=1 the beginning of a first region extends to the end of a second region over all n delay units, while for a value b=2 the beginning of the first region extends to the end of the second region over n/2 delay units.

10. The phase-locked loop of claim 9, wherein the length of each of the two regions is dimensioned such that it is more than a quarter of the distance from the beginning of the first region to the end of the second region according to the following condition: (f−e)>(h−e)/4 AND (h−g)>(h−e)/4, where the values e and f indicate the number of delay units at the beginning or end of the first region, and the values g and h indicate the number of delay units at the beginning or end of the second region, and the numbering of the delay units is consecutive from number 1 at the beginning of the delay element (3) to number n at the end of the delay element.

* * * * *

UNITED STATES PATENT AND TRADEMARK OFFICE
CERTIFICATE OF CORRECTION

PATENT NO. : 6,963,234 B2
DATED : November 8, 2005
INVENTOR(S) : Reiner Bidenbach It is certified that error appears in the above-identified patent and that said Letters Patent is hereby corrected as shown below:

Column 1,
Lines 42 and 46, delete "monitoring" and insert -- monitor --.

Column 2,
Line 8, delete "monitoring" and insert -- monitor --.

Column 6,
Lines 1 and 5, delete "monitoring" and insert -- monitor --.
Line 12, after "circuit" delete "4".
Line 27, after "detector" delete "(1)".

Signed and Sealed this

Twenty-eighth Day of February, 2006

JON W. DUDAS
*Director of the United States Patent and Trademark Office*